United States Patent
Jagannathan et al.

(10) Patent No.: US 9,761,722 B1
(45) Date of Patent: Sep. 12, 2017

(54) ISOLATION OF BULK FET DEVICES WITH EMBEDDED STRESSORS

(71) Applicant: International Business Machines Corporation, Armonk, NY (US)

(72) Inventors: Hemanth Jagannathan, Niskayuna, NY (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/191,608

(22) Filed: Jun. 24, 2016

(51) Int. Cl.
  *H01L 29/00* (2006.01)
  *H01L 29/78* (2006.01)
  *H01L 29/66* (2006.01)

(52) U.S. Cl.
  CPC ...... *H01L 29/785* (2013.01); *H01L 29/66545* (2013.01); *H01L 29/66795* (2013.01); *H01L 29/7842* (2013.01)

(58) Field of Classification Search
  CPC ............. H01L 29/785; H01L 29/66545; H01L 29/66795; H01L 29/7842
  See application file for complete search history.

(56) References Cited

U.S. PATENT DOCUMENTS

| | | | |
|---|---|---|---|
| 4,306,352 A | 12/1981 | Schrader | |
| 5,521,105 A | 5/1996 | Hsu et al. | |
| 5,646,431 A | 7/1997 | Hsu et al. | |
| 6,815,738 B2 | 11/2004 | Rim | |
| 6,972,461 B1 | 12/2005 | Chen et al. | |
| 7,235,451 B2 | 6/2007 | Hao et al. | |
| 7,382,654 B2 | 6/2008 | Hsu et al. | |
| 7,663,189 B2 | 2/2010 | Fukuda | |
| 8,067,291 B2 | 11/2011 | Shima | |
| 8,106,464 B2 * | 1/2012 | Cho | H01L 27/10814 257/401 |
| 8,853,037 B2 * | 10/2014 | Cho | H01L 21/76224 257/E21.619 |
| 8,928,086 B2 | 1/2015 | Utomo et al. | |

(Continued)

FOREIGN PATENT DOCUMENTS

| | | |
|---|---|---|
| JP | 2000243854 A | 9/2000 |
| KR | 1020050065908 A | 6/2005 |

OTHER PUBLICATIONS

Shamiryan et al., "Low-k dielectric materials", 2004, Materials Today, vol. 7, No. 1, pp. 24-37, published Jan. 2004.*

*Primary Examiner* — Nikolay Yushin
(74) *Attorney, Agent, or Firm* — Cantor Colburn LLP; Vazken Alexanian

(57) ABSTRACT

A field-effect transistor device and a method of isolating a field-effect transistor device. The method includes forming a layer of silicon germanium (SiGe) over a substrate, and fabricating a dummy gate stack above a silicon layer formed on the layer of SiGe. Etching the silicon layer defines a channel region below the dummy gate stack. The channel is isolated from the substrate by forming a cavity between the channel region and the substrate below the channel region, the cavity extending over a length of the channel region, wherein the length of the channel region extends from a source region to a drain region below the dummy gate stack. The cavity is filled with an oxide and a low K spacer material to isolate the channel region from the substrate.

18 Claims, 11 Drawing Sheets

(56) References Cited

U.S. PATENT DOCUMENTS

| | | | |
|---|---|---|---|
| 9,190,520 B2 | 11/2015 | Utomo et al. | |
| 9,224,865 B2 * | 12/2015 | Akarvardar | H01L 29/785 |
| 9,263,580 B2 | 2/2016 | Jacob et al. | |
| 2006/0076625 A1 | 4/2006 | Lee et al. | |
| 2013/0244387 A1 * | 9/2013 | Cho | H01L 21/76224 |
| | | | 438/283 |
| 2015/0021663 A1 * | 1/2015 | Akarvardar | H01L 29/785 |
| | | | 257/192 |
| 2016/0093726 A1 * | 3/2016 | Ching | H01L 29/785 |
| | | | 257/192 |

* cited by examiner

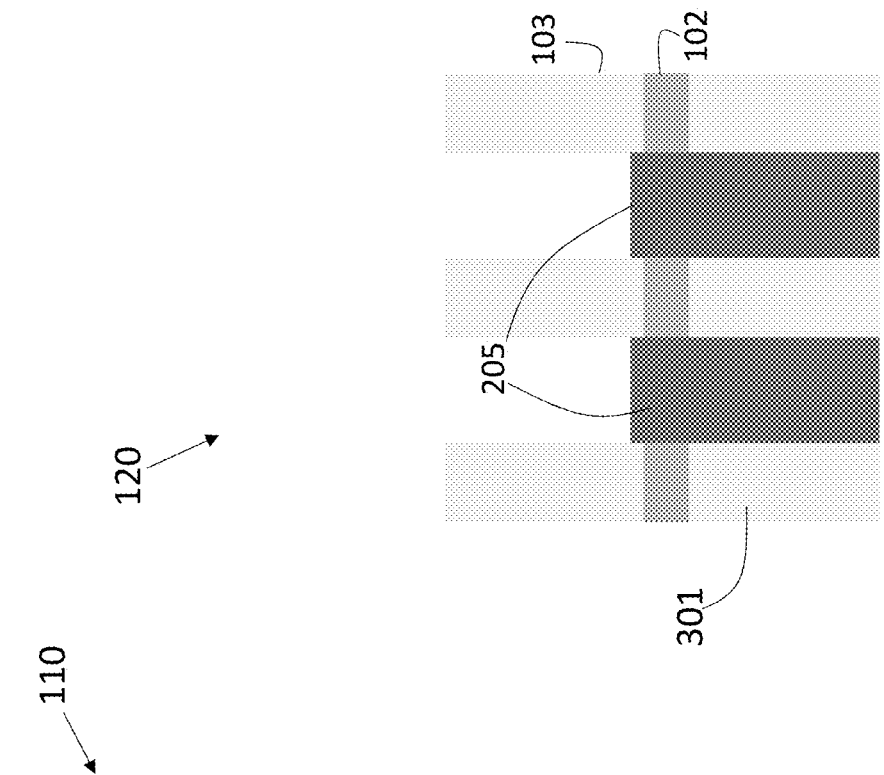
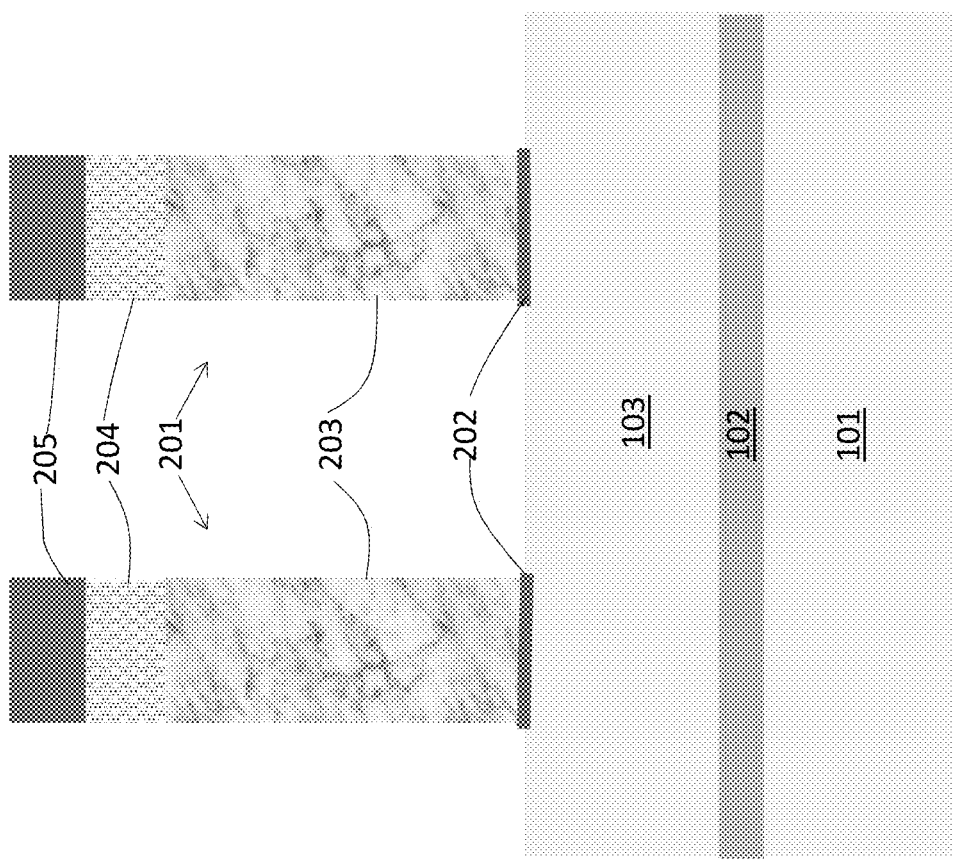

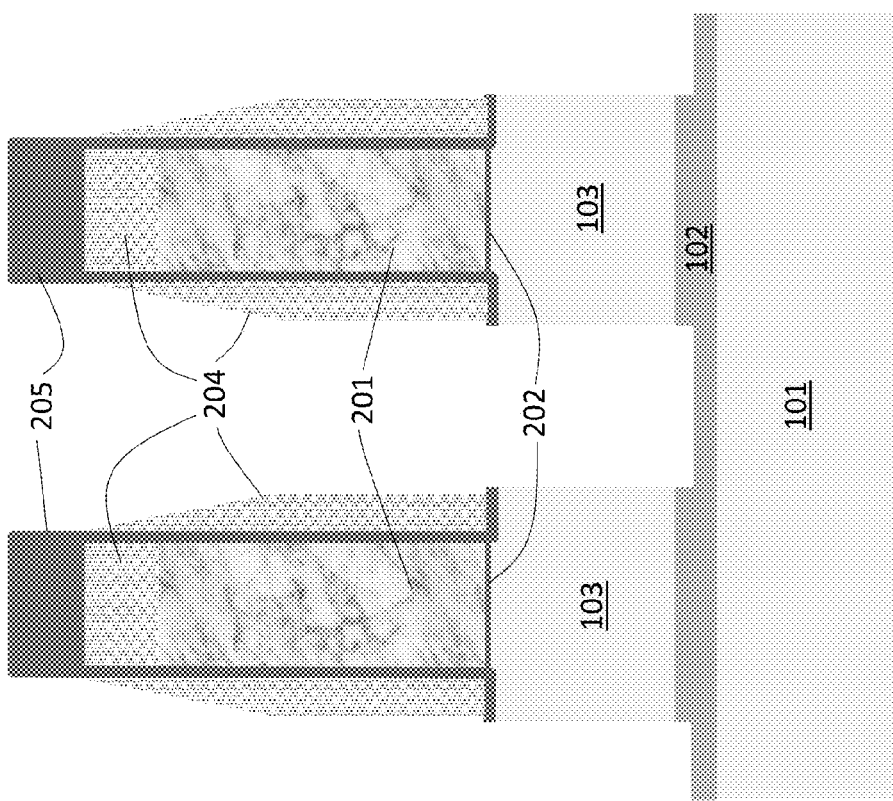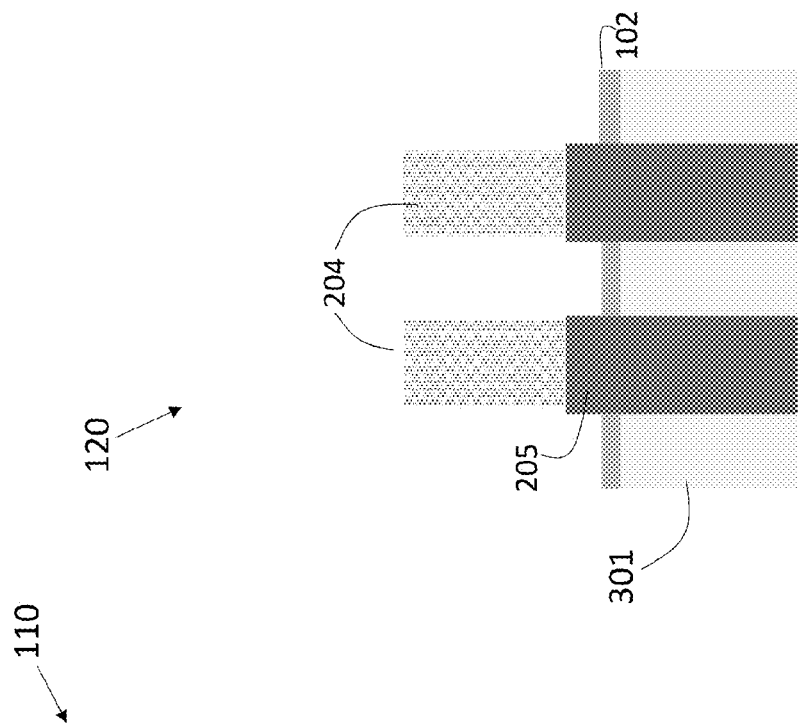

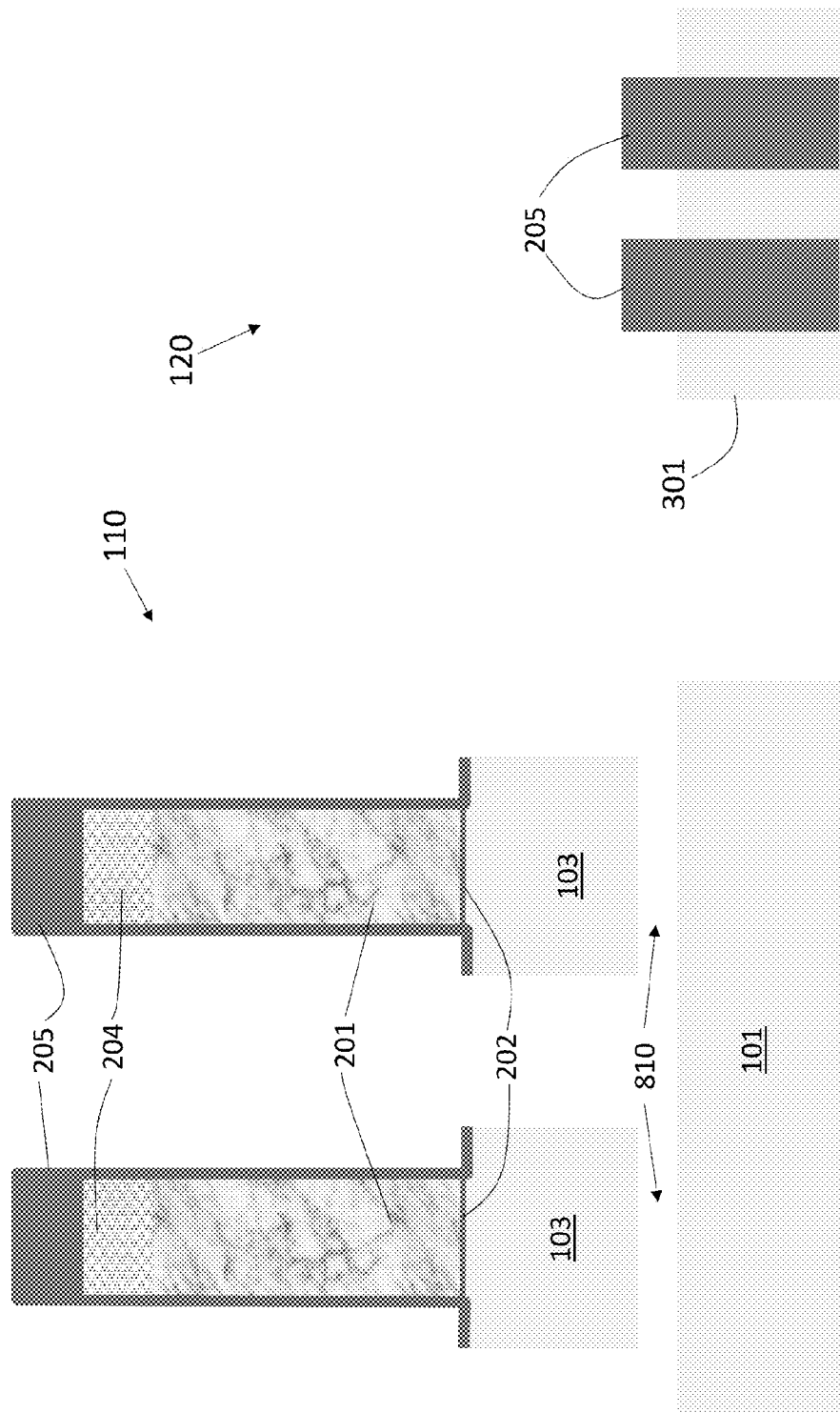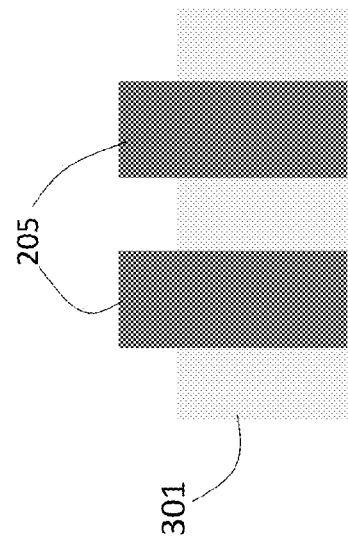

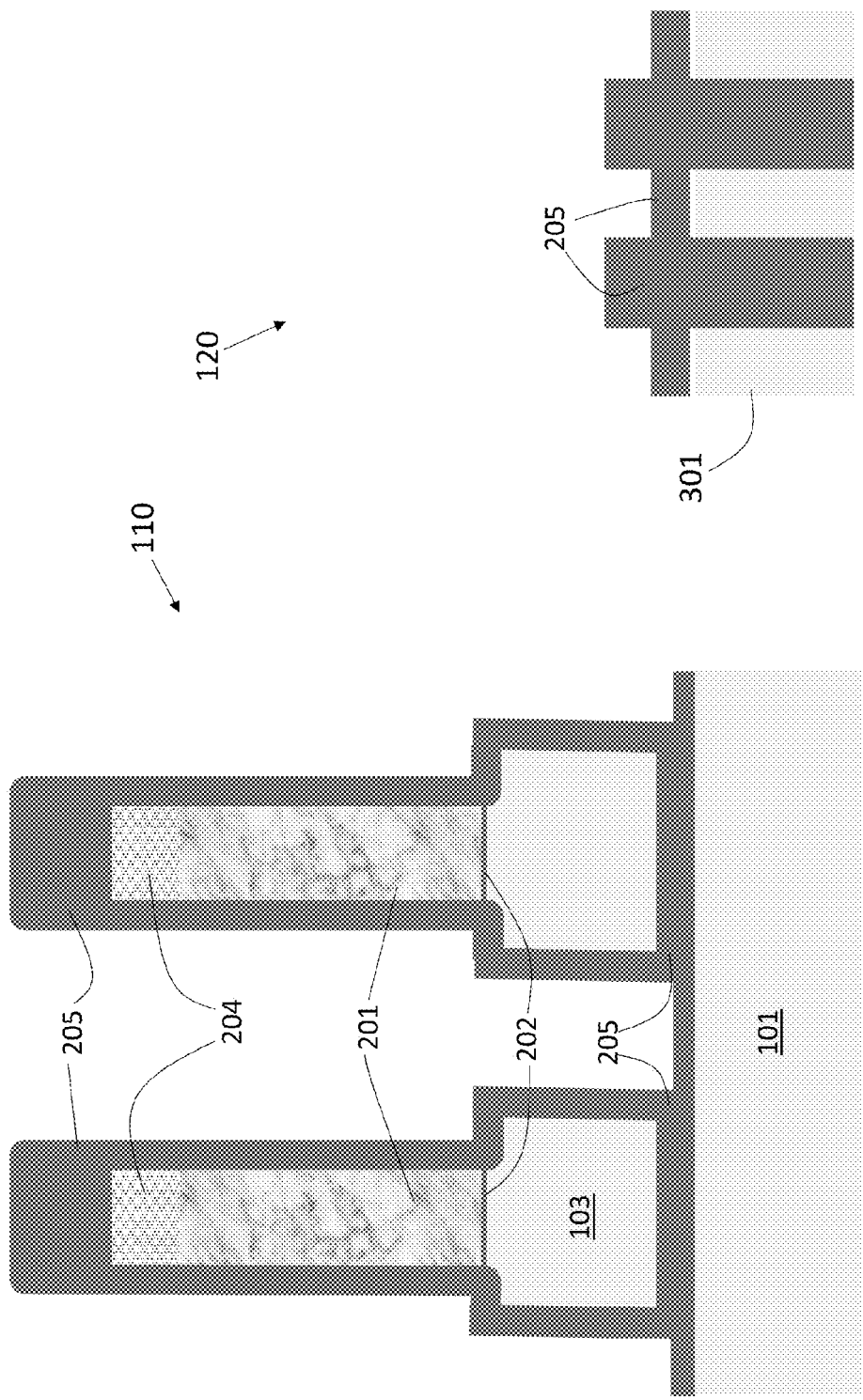

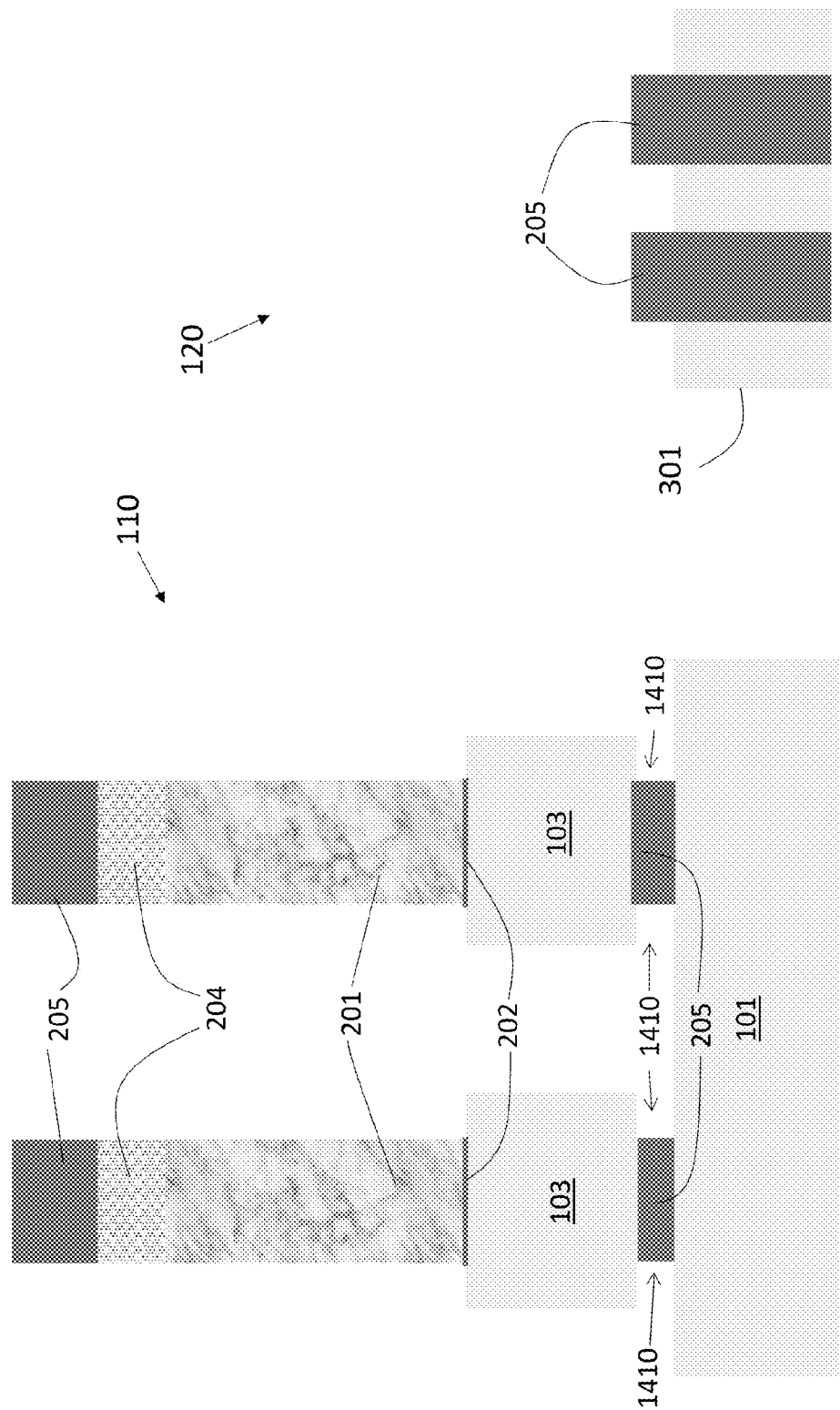

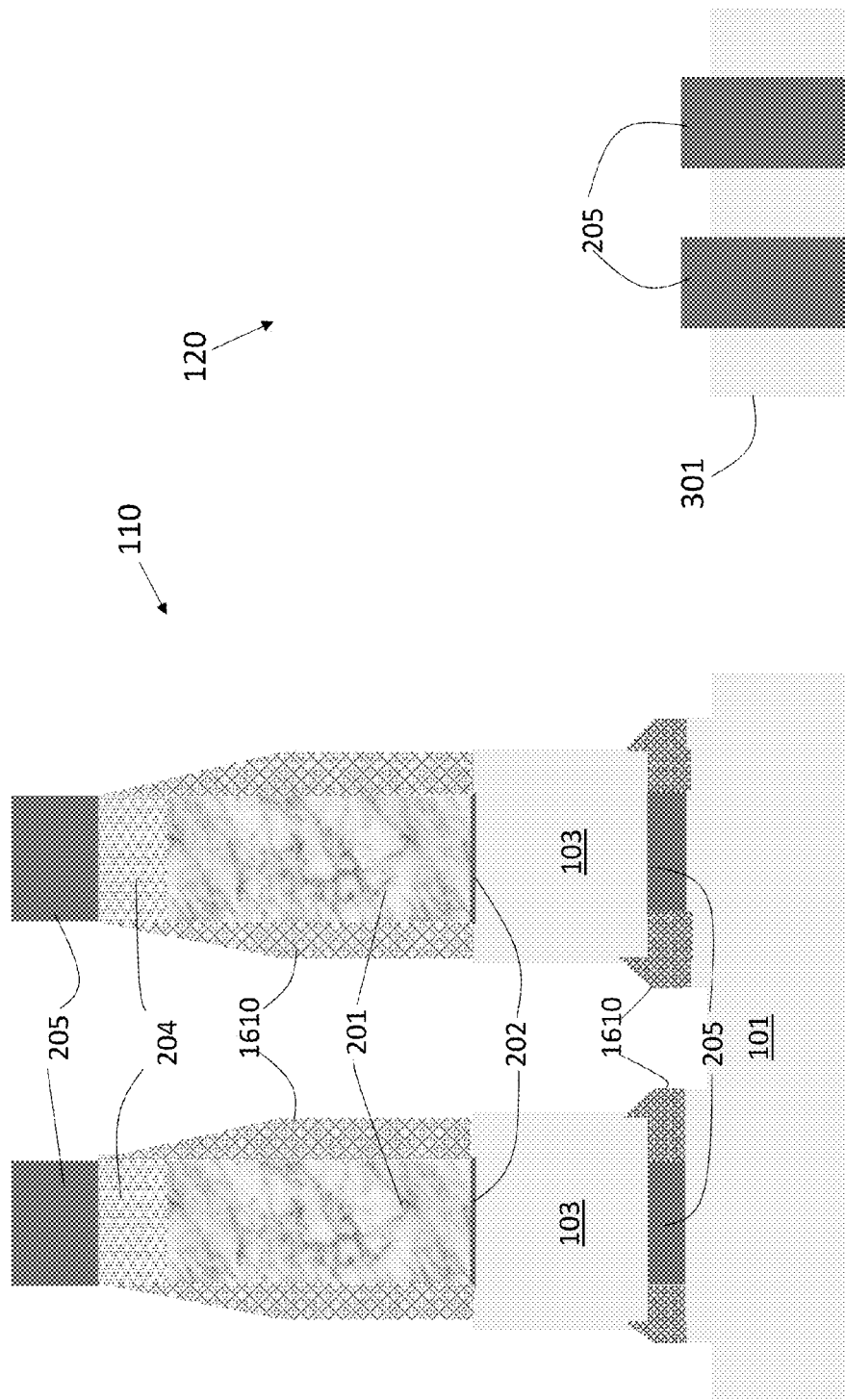

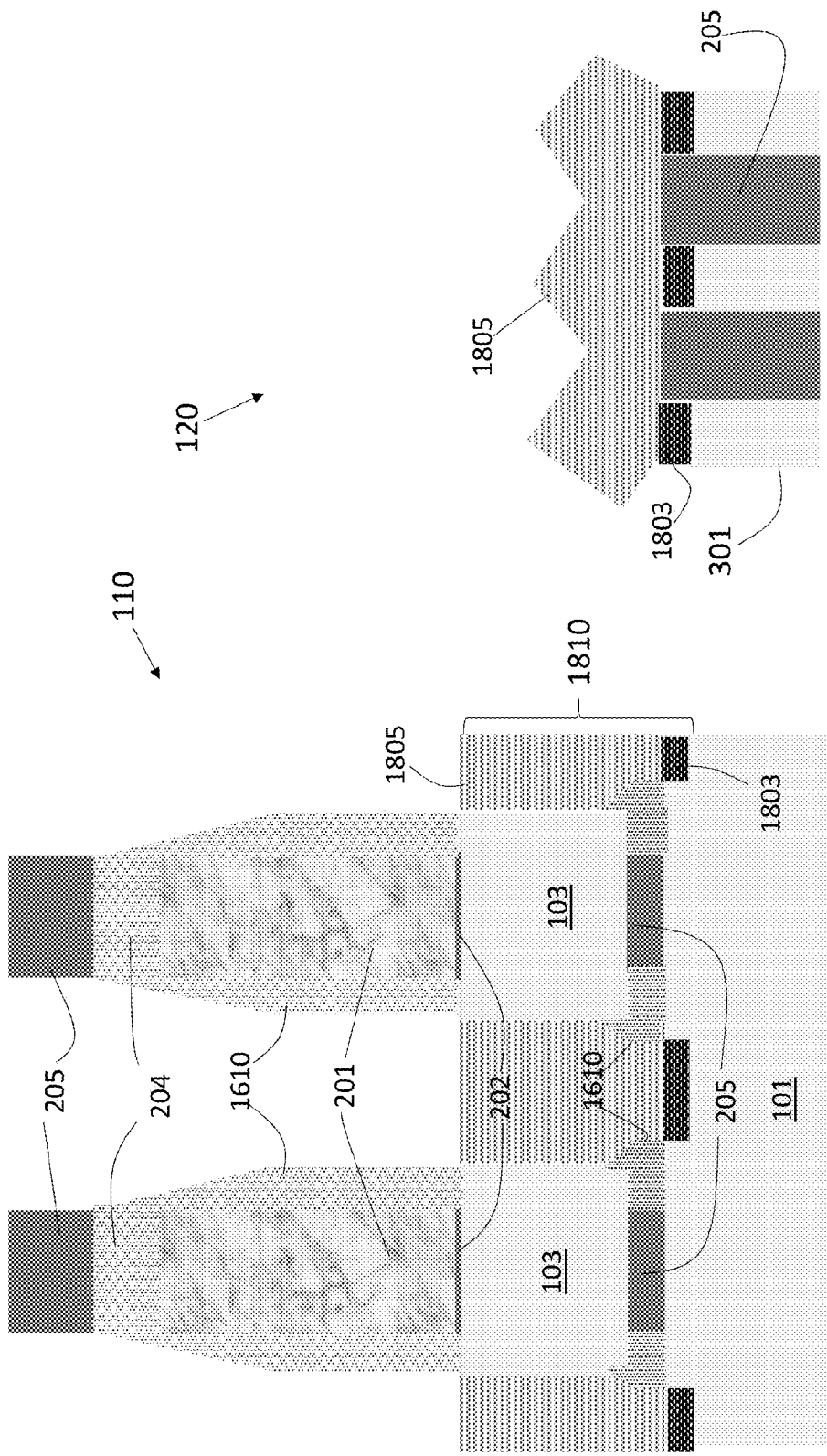

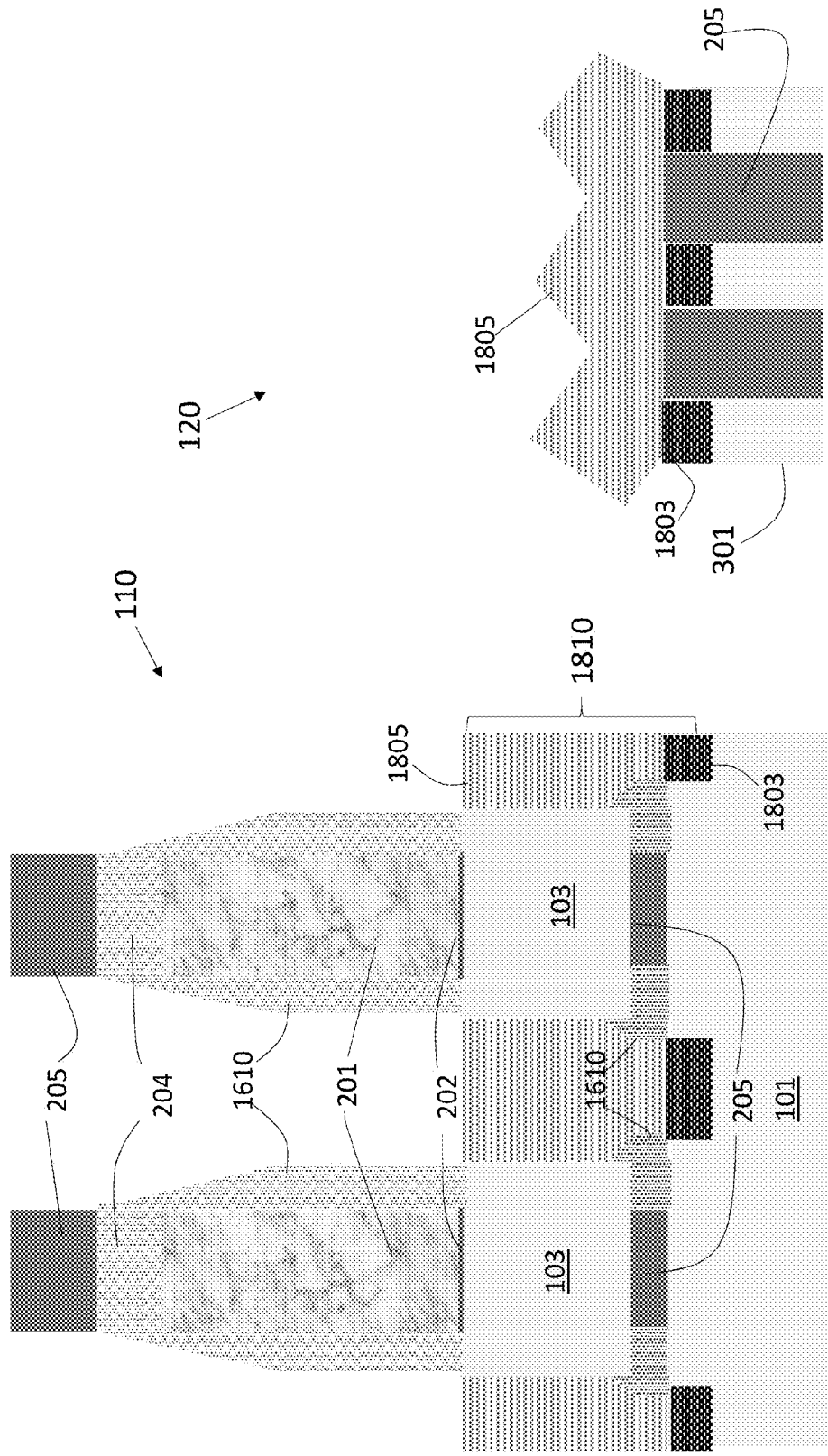

ISOLATION OF BULK FET DEVICES WITH EMBEDDED STRESSORS

BACKGROUND

The present invention relates to field effect transistor (FET) formation, and more specifically, to isolation of bulk FET devices with embedded stressors.

FET devices, such as finFETs and nanosheet FETs, include a channel region between the source and drain regions. Current in the channel region between the source and drain regions is controlled by gate voltage. In a finFET, the gate is formed over the channel region, and in a nanosheet FET, the gate is formed around the fins in a gate-all-around configuration.

SUMMARY

According to an exemplary embodiment of the invention, a method of isolating a field-effect transistor (FET) device includes forming a layer of silicon germanium (SiGe) over a substrate, and fabricating a dummy gate stack above a silicon layer formed on the layer of SiGe. Etching the silicon layer defines a channel region below the dummy gate stack. The method also includes forming a cavity between the channel region and the substrate below the channel region, the cavity extending over a length of the channel region, wherein the length of the channel region extends from a source region to a drain region below the dummy gate stack. The cavity is filled with an oxide and a low K spacer material to isolate the channel region from the substrate.

According to another exemplary embodiment, a FET device includes a substrate, and a channel region formed as a fin between a source region and a drain region on the substrate. A gate stack is formed above the channel region, and the channel region is isolated from the substrate by an oxide and a low K spacer material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-21 show the processes involved in fabricating the FET device with a channel region isolated from the substrate according to one or more embodiments, in which:

FIG. 2 shows a cross-sectional view across dummy gate stacks;

FIG. 3 shows a cross-sectional view across fins;

FIG. 4 shows the cross-sectional view across the dummy gate stacks following deposition of an oxide and a layer of silicon nitride;

FIG. 5 shows the cross-sectional view across the fins following deposition of the oxide and the silicon nitride;

FIG. 6 shows the result of a reactive ion etch process in the cross-sectional view across the dummy gates;

FIG. 7 shows the result of a reactive ion etch process in the cross-sectional view across the fins;

FIG. 8 shows the cavity formed below the channel region based on a selective etch;

FIG. 9 shows the result of a selective etch of a silicon germanium layer in the cross-sectional view across the fins;

FIG. 10 is a cross-sectional view showing the result of selectively etching silicon nitride spacers of the dummy gates;

FIG. 11 is a cross-sectional view showing the result of selectively etching silicon nitride above the oxide that separates the fins;

FIG. 12 shows the result of depositing additional oxide to fill the cavity below the channel region;

FIG. 13 shows the result of depositing additional oxide over the fins and the oxide separating the fins;

FIG. 14 shows notches formed from an over etch of the oxide below the channel region;

FIG. 15 shows the removal of oxide above the fins;

FIG. 16 shows a cross-sectional view with low K spacer material filling the notches formed below the channel region;

FIG. 17 shows that the spacer is not deposited on the fins;

FIG. 18 shows the structure that results from formation of a stressor;

FIG. 19 shows the stressor formed above the fins and oxide separating the fins;

FIG. 20 shows the formation of a stressor with a deeper undoped portion; and

FIG. 21 shows the deeper undoped portion above the fins.

DETAILED DESCRIPTION

As previously noted, a FET device may be a finFET or a nanosheet FET. Both the finFET and the nanosheet FET are non-planar or three-dimensional transistors used in processors. A finFET may be a multigate device with two or more gates that are controlled by a single gate electrode or by independent gate electrodes. A nanosheet FET or gate-all-around FET has gate material that surrounds the channel region on all sides. A type of breakdown that can occur in a FET device is punch through. Punch through results from the depletion regions around the source and drain regions merging into a single depletion region. This causes a rapidly increasing current below the channel with increasing drain-source voltage. In addition, punch through increases the output conductance and limits the maximum operating voltage of the FET device.

A prior approach to mitigating punch through involves a punch through stopper (PTS) or junction. The PTS is a region of higher dopant concentration below the channel than in the channel region. The PTS results in smaller source and drain depletion regions, thereby limiting the chances of the drain region depletion region increasing to merge with the source region depletion region to cause a punch through condition. The PTS can shift the threshold voltage. However, the PTS involves implantation of the dopant through the channel to the region below the channel. This can damage the channel. In addition, undesirable diffusion into the channel region (i.e., contamination of the channel) may occur during source and drain formation.

Turning now to an overview of the present disclosure, one or more embodiments relate to isolating the channel from the substrate by using a dielectric rather than a PTS junction. As detailed below, a cavity is formed below the channel region for deposition of a dielectric material. The disclosed approach facilitates isolation of the channel from the substrate without potential damage to the channel and with an increased barrier to diffusion (i.e., contamination) of the channel during source and drain formation.

In addition to the improved isolation itself, one or more embodiments detailed herein also facilitate increased stress in the source and drain regions. Stress enhancement in the source and drain regions improves performance of three-dimensional FET devices to the level of traditional planar devices. The stress enhancement may be achieved via an embedded stressor such as silicon germanium (SiGe), for example. The embedded stressor enhances performance by improving carrier mobility. The volume of SiGe is proportional to the stress. Thus, an increased volume of SiGe increases stress and improves mobility. Because the channel is completely isolated form the (doped) substrate according to one or more embodiments, the volume of the stressor may be increased as detailed below.

Figure 1:
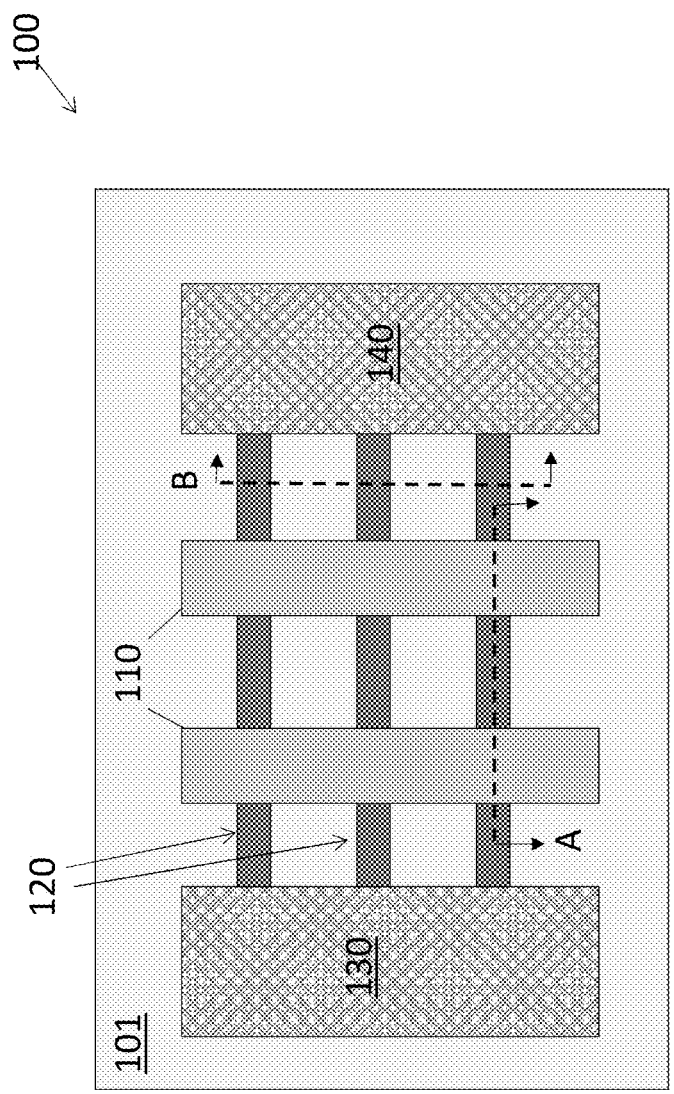
FIG. 1 is a FET device that is fabricated according to one or more embodiments of the invention.

FIG. 1 shows a simplified FET device 100 formed according to one or more embodiments. The FET device 100 is shown from a top-down perspective and may be a finFET or a nanosheet FET. For the exemplary FET device 100, two gates 110 and three fins 120 are shown formed on the substrate 101, between the source region 130 and the drain region 140. A cross-sectional view across the gates 110 is indicated by A, and a cross-sectional view across the fins 120 is indicated by B. These cross-sectional views are used to show the fabrication of the FET device 100.

Turning now to a more detailed description of one or more embodiments, FIGS. 2-21 show the processes involved in isolating the channel from the substrate in a FET device. The processes precede the removal of a dummy gate 201 for replacement with the gate 110. FIGS. 2 and 3 show two different cross-sectional views 110, 120 of an intermediate structure involved in the fabrication process of the FET device 100 according to embodiments of the invention. The cross-sectional views 110, 120 correspond, respectively, with the cross-sectional views indicated by A and B in FIG. 1 such that FIG. 2 shows a cross-sectional view 110 across the dummy gates 201, and FIG. 3 shows a cross-sectional view 120 across the fins 301 (formed from the substrate 101). Both cross-sectional views 110, 120 show the substrate 101 with a SiGe layer 102 above it. The SiGe layer may be 10-20 nanometers (nm) thick.

In FIG. 2, this SiGe layer 102 may be the location of the PTS in a conventional FET device. The substrate 101 may be a silicon (Si) substrate. An epitaxially gown Si layer 103 is shown above the SiGe layer 102. A sacrificial oxide 202 is at the bottom of the dummy gate stack. The oxide 202 may be silicon dioxide ($SiO_2$). The dummy gate 203 is comprised of poly silicon. The poly silicon thickness may be between 50 nm and 150 nm. A hard mask 204 nitride (e.g., silicon nitride (SiN)) or bilayer oxide/nitride is formed above the dummy gate 203 and may be 10 to 50 nm in thickness. A shallow trench isolation (STI) oxide 205 or nitride is at the top of the dummy gate stack. The oxide 205 may be $SiO_2$ like the sacrificial oxide 202. In FIG. 3, the cross-sectional view 120 across the fins 301 shows that the STI oxide 205 is deposited between the fins 301.

Figure 5:
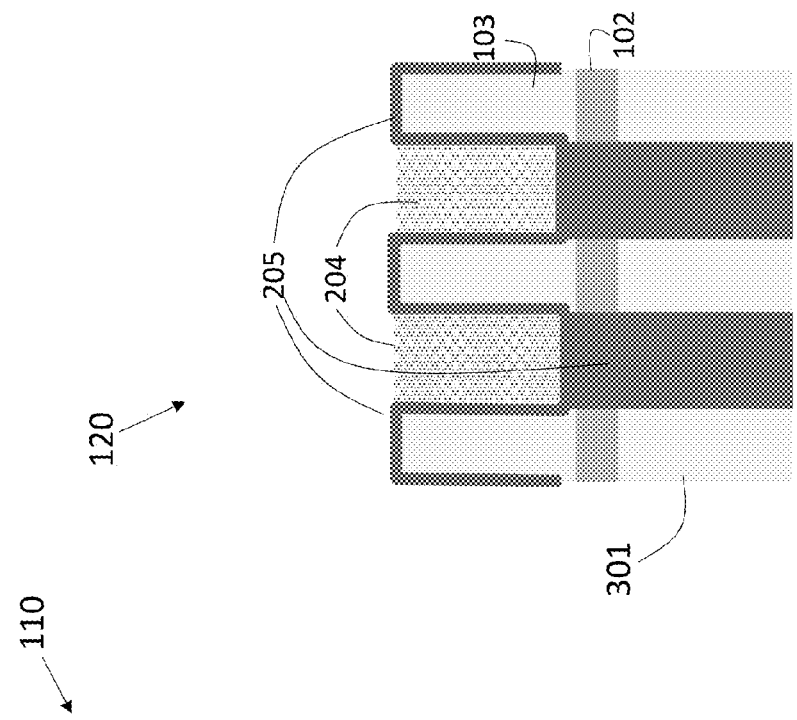
Figure 4:
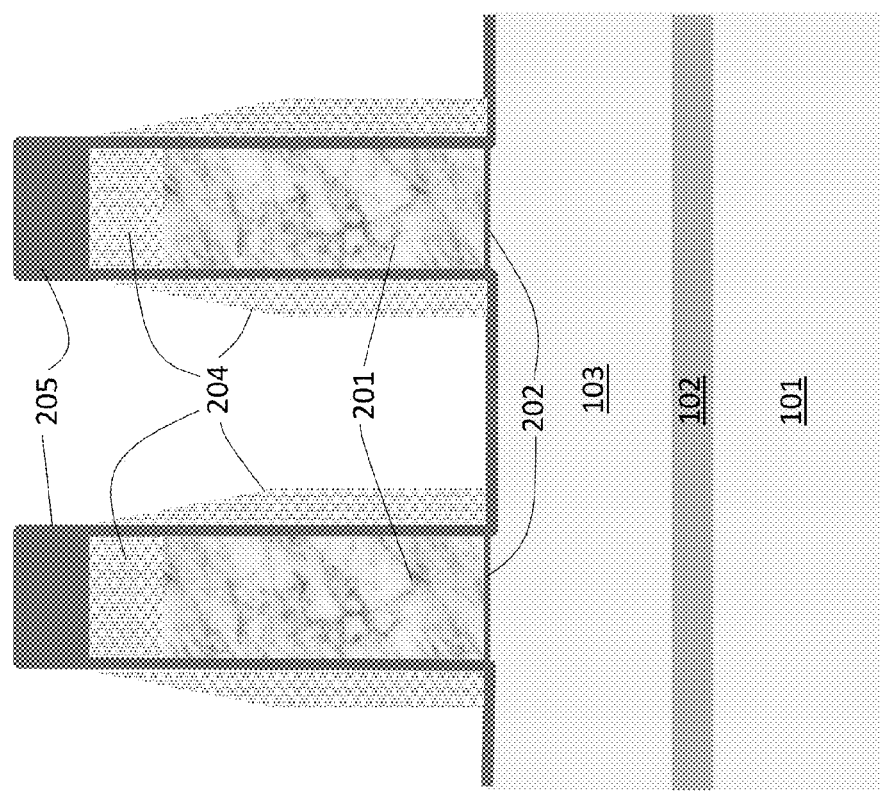
Figure 9:
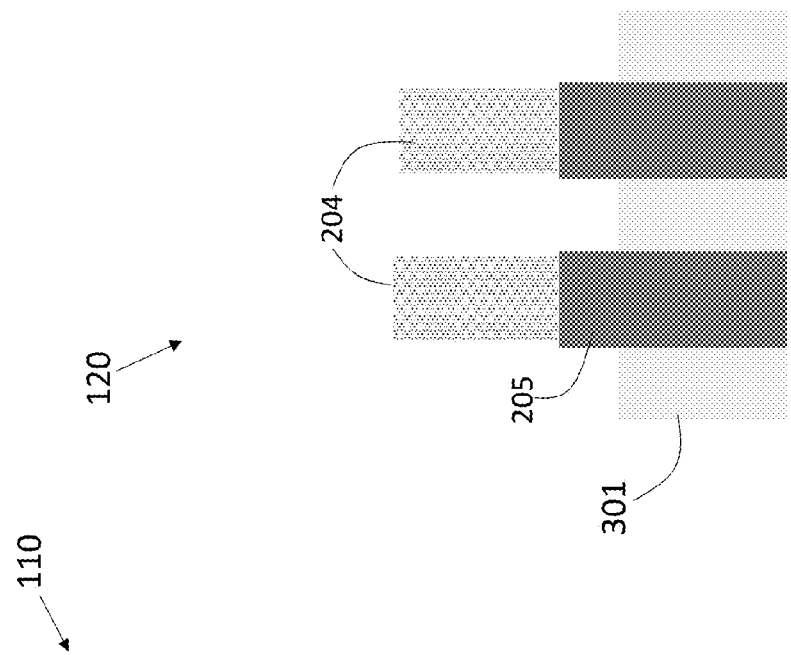

FIGS. 4 and 5 show the cross-sectional views 110, 120 following a deposition of oxide 205 and hard mask 204. The oxide 205 is deposited conformally. A thicker layer of the hard mask 204 (than oxide 205) is deposited conformally. This deposition is followed by a reactive ion etch (RIE) process. The RIE process is performed directionally such that the top surface is etched rather than the sides. The RIE process results in the shape of the SiN 204 on the sides of the dummy gates 201 shown in FIG. 4. As the cross-sectional view 120 in FIG. 5 shows, the oxide 205 is conformally deposited over the fins 301 and the hard mask 204 is deposited above the oxide 205 between the fins 301. While the hard mask 204 above the oxide 205 pinches off the space between the oxide 205 spacers, as shown in FIG. 5, the hard mask 204 does not pinch off the space between the oxide 205 spacers (of adjacent dummy gates 201), as shown in FIG. 4.

FIGS. 6 and 7 are cross-sectional views 110, 120 that show the result of performing another RIE process. This post-fin recess stops on the SiGe layer 102. As FIG. 6 shows, the Si layer 103 that forms the channel remains below the dummy gates 201 but the remainder of the Si layer 103 is etched, and some of the SiGe layer 102 is recessed. As FIG. 7 shows, the Si layer 103 surrounding the hard mask 204 and the oxide 205 above it are recessed along with part of the SiGe layer 102 below. The oxide 205 on the sides of the hard mask 204 may or may not be recessed. The oxide 205 on the sides of the hard mask 204 is shown to be recessed in exemplary cross-sectional view 120 in FIG. 7.

Figure 8:
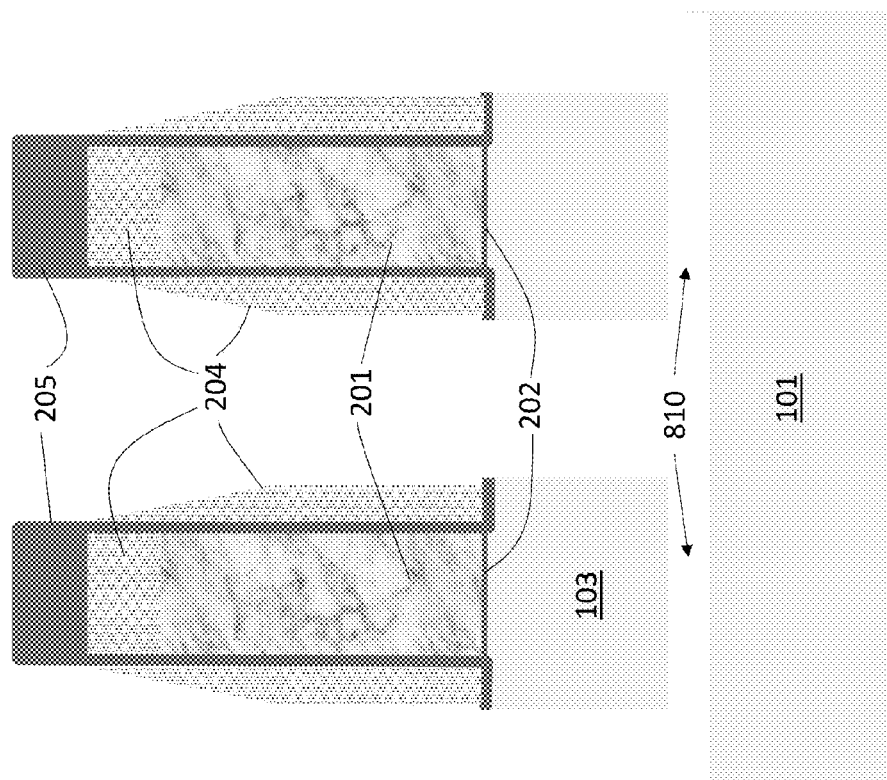

At this stage, a selective etch of the SiGe layer 102 is performed. The etchant may be a hydrochloric acid (HCl), for example. FIG. 8 shows that the selective etch of the SiGe layer 102 results in a cavity 810 between the channel region (Si layer 103) and the substrate 101. Although the cross-sectional view 110 makes the channel region and dummy gate stack appear to be unsupported (levitating) above the substrate 101, the portions of the gate in front of and behind the cross-section visible in FIG. 8 that are on the substrate 101 facilitate the etching of the cavity 810. As FIG. 9 indicates, the SiGe layer 102 is selectively etched from above the fins 301, as well.

FIGS. 10 and 11 show the result of a selective etch of the hard mask 204. A wet etching process with heated phosphoric acid ($H_3PO_4$) may be used. The cross-sectional view 110 in FIG. 10 shows that the hard mask 204 on the sides of the dummy gate stack is etched. The hard mask 204 above the dummy gate 201 is protected and, thus, not etched. FIG. 11 shows that the hard mask 204 above the oxide 205 is etched.

FIGS. 12 and 13 show the result of depositing additional nitride or oxide 205 on the intermediate structure shown in FIGS. 10 and 11. The nitride or oxide 205 fills the cavity 810 below the channel region (Si layer 103), as shown in FIG. 10. The nitride or oxide 205 may be a single dielectric liner or dual liner oxide nitride for dielectric isolation. The nitride or oxide 205 may also be a low k dielectric. The nitride or oxide 205 covers the fins 301 and the existing oxide 205, as shown in FIG. 11. An isotropic etch then results in the cross-sectional views 110, 120 shown in FIGS. 14 and 15.

The isotropic etch of the oxide 205 may involve a wet etch process or an RIE process. As FIG. 14 indicates, an over etch is performed to form a notch 1410 below the channel region (Si layer 103) where the cavity 810 has been formed (see e.g., FIG. 8). Some of the oxide 205 remains below the channel region and separates the channel region from the substrate 101. As FIG. 15 shows, the oxide 205 above the fins 301 is completely etched and some of the oxide 205 in the oxide 205 stack between the fins 301 is etched.

FIGS. 16 and 17 show the result of a low K spacer 1610 deposition. The spacer 1610 may be SiN (like the hard mask 204 above the fins 301). The spacer 1610 may instead be a silicon-boron-carbon-nitrogen (SiBCN) material or an organosilicon compound such as silicon-oxygen-carbon nitrogen (SiOCN). As FIG. 16 shows, the spacer 1610 is formed on the sides of the fins 301 and within the notches 1410. A directional RIE process is performed to obtain the shape of the spacer 1610 shown in FIG. 16. As FIG. 16 indicates, the channel region (Si layer 103) is completely isolated from the substrate 101. FIG. 17 indicates that the spacer 1610 is etched over the fins 301 during the directional RIE.

FIGS. 18-21 show the stressor 1810 that is facilitated by the isolation of the channel region from the substrate 101. An undoped portion 1803 of the stressor 1810 is epitaxially grown on the substrate 101, as shown in the cross-sectional view 110 of FIG. 18. The undoped portion 1803 is grown on the fins 301, as shown in the cross-sectional view 120 of FIG. 19. This undoped portion 1803 may be SiGe in a p-type FET device (pFET). The undoped portion 1803 may be Si or silicon carbide (SiC) in an n-type FET device (nFET). The undoped portion 1803 is a junction for further isolation of the channel region (Si layer 103) in FIG. 18. The stressor 1810 also includes a doped portion 1805. The doped portion may be epitaxially grown and in-situ doped. The doped portion 1805 may be boron (B)-doped SiGe in a pFET and may be Si phosphorous or Si arsenic in an nFET.

FIGS. 20 and 21 show an alternate embodiment in which the undoped portion 1803 is grown deeper. FIG. 20 shows a cross-sectional view 110 with a stressor 1810 grown on the substrate 101. The stressor 1810 includes the undoped portion 1803 and the doped portion 1805. FIG. 21 shows a cross-sectional view 120 with the undoped portion 1803 and the doped portion 1805 grown above the fins 301. The undoped portion 1803 is grown in a thicker layer according to the embodiment shown in FIGS. 20 and 21 than in the embodiment shown in FIGS. 18 and 19. The deeper etch into the substrate to accommodate the thicker undoped portion 1803 is facilitated by the fact that the channel region (Si layer 103) is completely isolated from the substrate 101. The increased depth of the undoped portion 1803 increases the volume of the stressor 1810. The increased volume results in increased stress and, thereby, improved performance.

It is understood that, although this disclosure includes a detailed description of the formation and resulting structures for a specific types of FET devices, implementation of the teachings recited herein are not limited to a particular type of FET device. Rather embodiments of the present disclosure are capable of being implemented in conjunction with any other type of FET device, now known or later developed.

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and FET fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of isolating a field-effect transistor (FET) device, the method comprising:
   forming a layer of silicon germanium (SiGe) over a substrate;
   fabricating a dummy gate stack above a silicon layer formed on the layer of SiGe;
   etching the silicon layer to define a channel region below the dummy gate stack;
   forming a cavity between the channel region and the substrate below the channel region, the cavity extending over a length of the channel region, wherein the length of the channel region extends from a source region to a drain region below the dummy gate stack; and
   filling the cavity with an oxide and a low K spacer material to isolate the channel region from the substrate.

2. The method of isolating the FET device according to claim 1, further comprising depositing oxide and silicon nitride (SiN).

3. The method of isolating the FET device according to claim 1, wherein the depositing the oxide is performed conformally, and the depositing the SiN is followed by a reactive ion etching process to shape spacers adjacent to the oxide covering the dummy gate stack.

4. The method of isolating the FET device according to claim 3, further comprising selectively etching the spacers adjacent to the oxide covering the dummy gate stack following the forming the cavity.

5. The method of isolating the FET device according to claim 1, wherein the etching the silicon layer to define the channel region includes partially etching the layer of SiGe.

6. The method of isolating the FET device according to claim 5, wherein the forming the cavity includes selectively etching a remainder of the layer of SiGe.

7. The method of isolating the FET device according to claim 6, wherein the selectively etching includes using hydrochloric acid as an etchant.

8. The method of isolating the FET device according to claim 1, wherein the filling the cavity includes performing an oxide etch after depositing the oxide to leave peripheral portions of the cavity as unfilled notches.

9. The method of isolating the FET device according to claim 8, wherein the filling the cavity includes filling the unfilled notches with the low K spacer material.

10. The method of isolating the FET device according to claim 8, wherein the performing the oxide etch includes performing an isotropic etch with an over etch.

11. The method of isolating the FET device according to claim 1, further comprising fabricating a stressor adjacent to the channel region on the substrate.

12. The method of isolating the FET device according to claim 11, wherein the fabricating the stressor includes epitaxially growing an undoped portion of the stressor on the substrate, wherein the epitaxially growing the undoped portion includes selecting a height of the undoped portion.

13. The method of isolating the FET device according to claim 12, wherein the fabricating the stressor includes epitaxially growing and in-situ doping a doped portion of the stressor on the undoped portion.

14. A field-effect transistor (FET) device, comprising:
    a substrate;
    a channel region formed as a fin between a source region and a drain region on the substrate;
    a gate stack formed above the channel region, wherein the channel region is isolated from the substrate by an oxide and a low K spacer material; and
    a stressor formed on the substrate adjacent to the channel region, wherein the stressor includes an undoped portion on the substrate.

15. The FET device according to claim 14, wherein the oxide is between the low K spacer material.

16. The FET device according to claim 14, wherein the undoped portion is silicon germanium based on the device being a p-type FET device and the undoped portion being silicon or silicon germanium based on the device being an n-type FET device.

17. The FET device according to claim 14, wherein the stressor includes a doped portion above the undoped portion.

18. The FET device according to claim 17, wherein the doped portion is boron-doped silicon germanium based on the device being a p-type FET device and the doped portion is phosphorous-doped silicon or arsenic-doped silicon based on the device being an n-type FET device.

* * * * *